United States Patent [19]
Linnenbrink et al.

[11] Patent Number: 5,923,061
[45] Date of Patent: Jul. 13, 1999

[54] CCD CHARGE SPLITTER

[75] Inventors: Thomas E. Linnenbrink, Monument, Colo.; Mark Wadsworth, Richardson, Tex.; Stephen D. Gaalema, Colorado Springs, Colo.

[73] Assignee: Q-Dot, Inc., Colorado Springs, Colo.

[21] Appl. No.: 08/880,207

[22] Filed: Jun. 23, 1997

Related U.S. Application Data

[62] Division of application No. 08/511,655, Aug. 7, 1995, Pat. No. 5,708,282.

[51] Int. Cl.$^6$ .......................... H01L 27/148; H01L 29/768
[52] U.S. Cl. .......................... 257/240; 257/241; 257/243; 348/312; 348/315; 348/318
[58] Field of Search ..................................... 257/240, 241, 257/243; 348/312, 315, 318

[56] References Cited

U.S. PATENT DOCUMENTS

| | | | |
|---|---|---|---|
| 4,387,389 | 6/1983 | Tanigawa | 358/37 |
| 4,725,748 | 2/1988 | Hayes et al. | 307/607 |
| 4,733,407 | 3/1988 | Pathuis et al. | 377/62 |
| 5,061,927 | 10/1991 | Linnenbrink et al. | 341/138 |
| 5,189,423 | 2/1993 | Linnenbrink et al. | 341/172 |
| 5,327,138 | 7/1994 | Linnenbrink et al. | 341/172 |
| 5,708,282 | 1/1998 | Linnenbrink et al. | 257/240 |

OTHER PUBLICATIONS

Bencuya, S.S., Steckl, A.J., Vogelsong, T.L. and Tiemann, J.J., *Dynamic Packet Splitting in Charge Domain Devices*, 3–9 IEEE 268 (Sep., 1982).

*Primary Examiner*—Ngân V. Ngô
*Attorney, Agent, or Firm*—Welsh & Katz, Ltd.

[57] ABSTRACT

An apparatus and method of equalizing a first and second charge packet. The apparatus includes a charge splitter for splitting the first charge packet into a third charge packet on the first side of the charge splitter and a fourth charge packet on the second side of the charge splitter. The second charge component is split into a fifth charge component on the first side of the charge splitter and a sixth charge component on the second side of the charge splitter. The apparatus includes a charge combiner for adding the third and sixth charge packets and the fourth and fifth charge packets.

7 Claims, 5 Drawing Sheets

CCD CHARGE SPLITTER

This is a divisional of application Ser. No. 08/511,655, filed Aug. 7, 1995, now U.S. Pat. No. 5,701,282.

FIELD OF THE INVENTION

The field of the invention relates to charge coupled devices and in particular to charge splitters implementing a 2 to 1 binary split.

BACKGROUND OF THE INVENTION

Charge coupled devices (CCDs) (e.g., photodetectors, analog to digital converters, signal processors, etc.) are known. Such devices are used for accomplishing charge domain operations such as charge packet transfer, summation, and splitting. CCDs are useful in certain signal processing operations such as decoding of radio frequency signals. For example, charge domain filters have been constructed which provide finite impulse response (FIR) filtering or infinite impulse response filtering (IIR) filtering, often from within a single CCD device at very low rates of power consumption.

Charge domain analog to digital (A/D) converters are further examples of CCD devices that process signals in the charge domain. Charge domain A/D converters, in fact, are often used in conjunction with charge domain FIR or IIR filtering devices because signals received by a radio frequency receiver in the frequency domain are often more efficiently processed in the charge domain before conversion to the digital domain within the charge domain A/D converter.

One of the listed charge domain operations, charge splitting, is of critical importance in charge domain analog to digital (A/D) or digital analog (D/A) converters in that it is used to implement fractional multiplication by binary weighting (i.e., ½) and therefore is one of the fundamental operations in A/D and D/A converters. Charge splitting, as a consequence, determines conversion accuracy, and therefore the converter characteristics, such as linearity, spurious response and effective bits. Charge splitting serves a similar functionality in charge domain finite impulse response (FIR) and infinite impulse response (IIR) filters.

It has been suggested that charge splitting may be accomplished by creating a field oxide barrier in a charge transfer channel and clocking a charge packet into adjacent but isolated reservoirs separated by the barrier. Such a suggestion is based upon the assumption that charge distribution of the charge packet in the charge channel passing the barrier is uniform and reproducible. The suggestion is also based upon the assumption that the barrier can be accurately located within the charge channel and that the divided charges may then be later removed from the isolated reservoirs without recombining the previously divided charge.

Charge splitting error produced under the previously suggested methods have ranged from as high as a few percent to as little as a few tenths of a percent. Efforts aimed at improving accuracy have included increasing the width of the charge channel (to reduce the impact of an inaccurately placed charge splitter) and placing dummy splitters in the charge channel to compensate for nonlinearities caused by edge effects and to equalize lateral forces applied to charge carriers. Because of the importance of charge splitting in CCDs, a need exists for a method of improving the accuracy of charge splitting that is not dependent upon process parameters used in creating the CCDs.

SUMMARY OF THE INVENTION

It is an object of the invention to provide a charge splitter that divides a charge packet into two equal charge packets with improved accuracy over the prior art.

It is a further object of the invention to provide a charge splitter that can be used in an iterative mode to achieve varying levels of improved accuracy.

It is a further object of the invention to provide a charge splitter that can continuously process charge mode signals.

These and other objects are provided by an apparatus and method of equalizing a first and second charge. The apparatus includes a charge splitter for splitting the first charge packet into a third charge component on the first side of the charge splitter and into a fourth charge component on the second side of the charge splitter. The second charge packet is split within the charge splitter into a fifth charge component on the first side of the charge splitter and a sixth charge component on the second side of the charge splitter. The apparatus includes a combiner for adding the third component and sixth component and the fourth and fifth components.

BRIEF DESCRIPTION OF A PREFERRED EMBODIMENT

Under an embodiment of the invention, accurate charge splitting is accomplished through an iterative charge splitting process involving at least one charge splitter and a series of charge transfer gates. To aid the reader in his understanding of the embodiment, an explanation will first be offered of charge transfer and splitting. Following the explanation of charge transfer and splitting, a novel process of splitting a charge into two nominally equal components offering greatly improved accuracy will be described in detail.

Figure 1:
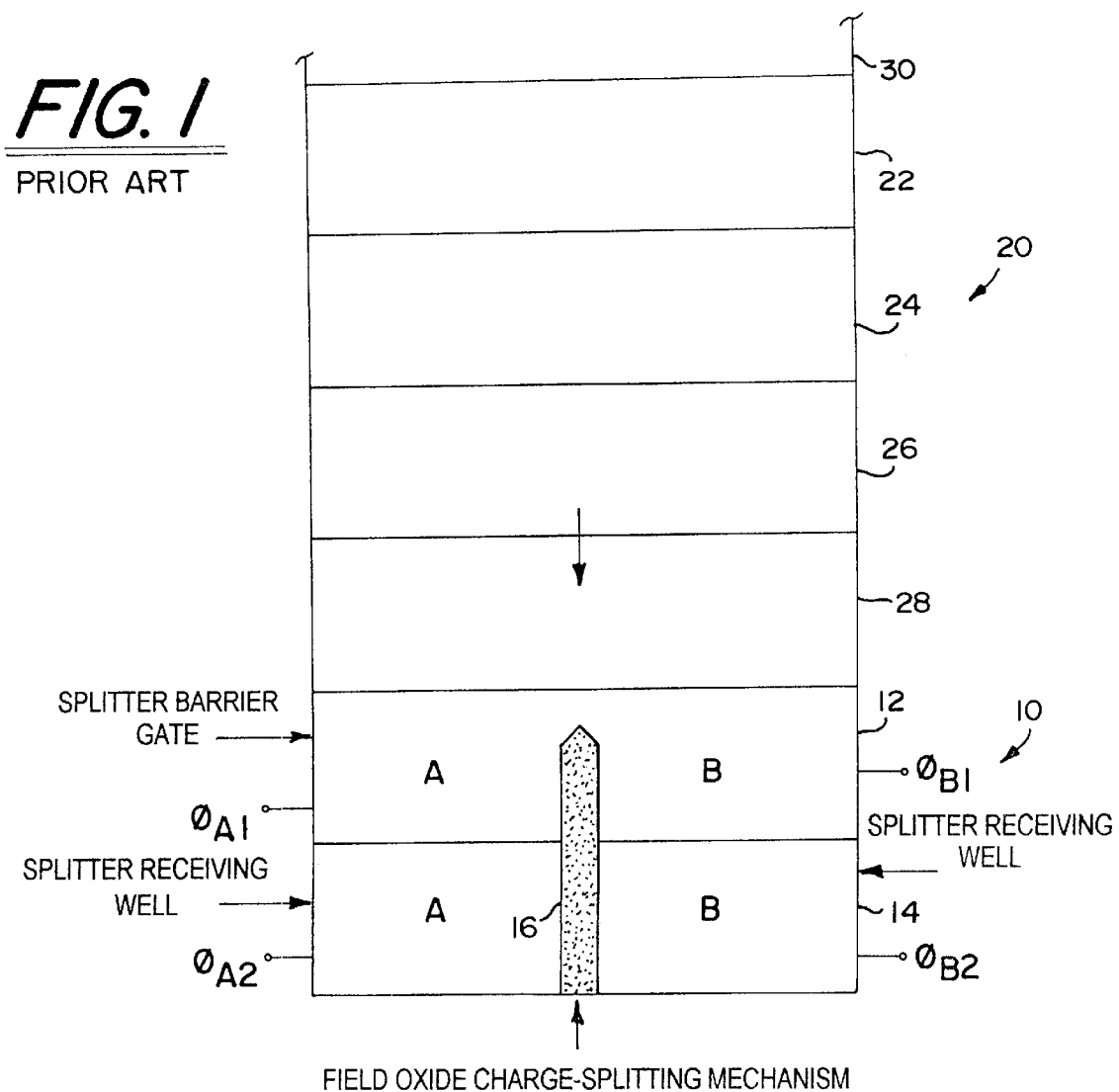
FIG. 1 depicts a prior art charge splitter and charge transfer gates.

FIG. 1 shows a CCD charge splitter 10 and transfer gates 20 in accordance with an embodiment of the invention. Under the embodiment, a charge splitter 10 is comprised of a charge splitting barrier gate 12, a splitter receiving well 14 and a field oxide charge-splitting barrier mechanism 16. (The charge splitter 10 could also be fabricated through the use of an overlapped polysilicon gate.) The charge transfer gates 20 may have a similar structure from one gate to the next and may rely on a connection to a multi-phase (e.g., a 4-phase) clock for proper operation.

Figure 2:
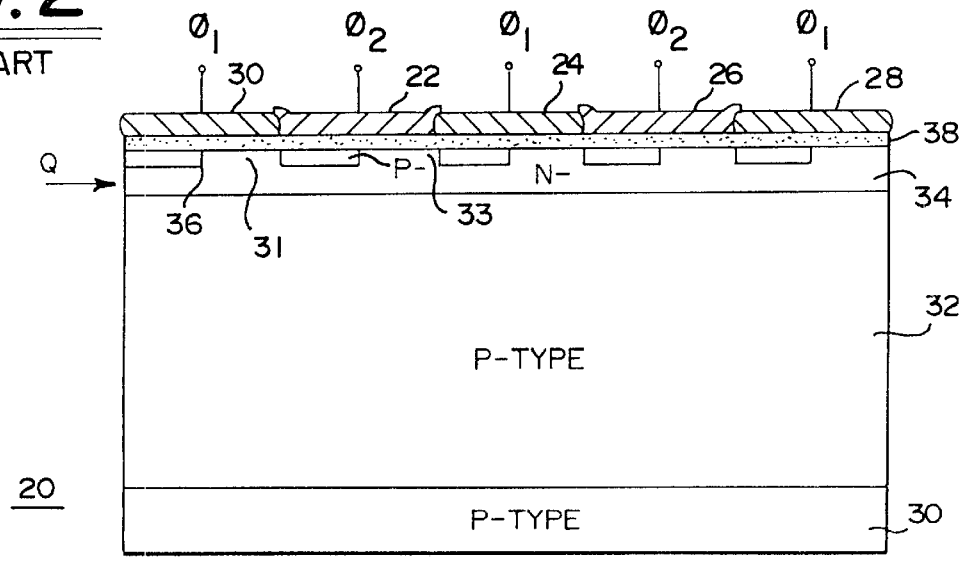
FIG. 2 depicts a prior art charge transfer gate.
Figure 3A:
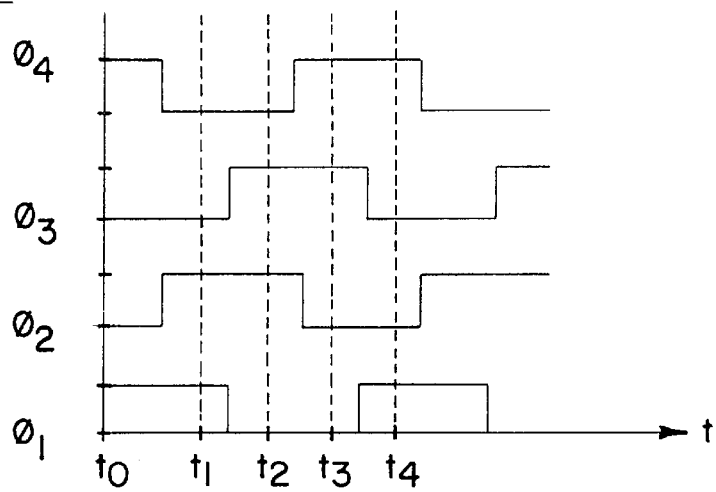
FIG. 3 is a time line diagram of charge transfer using a four-phase clock.
Figure 3B:
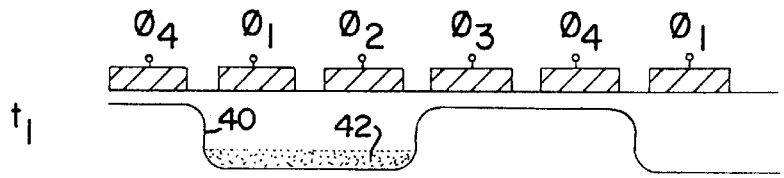
Figure 3C:
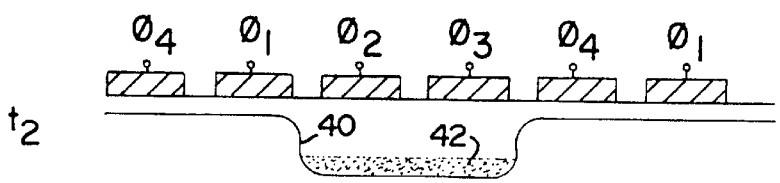
Figure 3D:
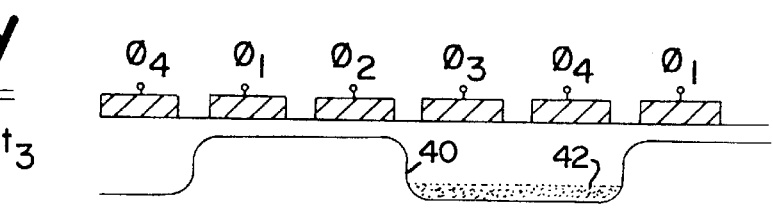
Figure 3E:
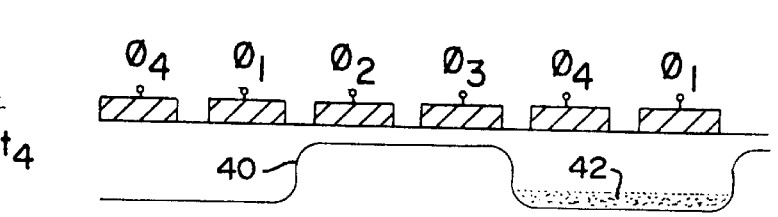

FIG. 2 is a cross-section of a particular type of transfer channel (i.e., an interline charge transfer channel) of transfer gates 20 that may be used under the embodiment in conjunction with the charge splitter 10. Under the embodiment, the charge transfer channel (i.e., gates 20) and the charge splitter 10 may be is fabricated using conventional CCD technology. The CCD backside substrate 30 may be comprised of a single carrier-type semiconductor material, such as P-type crystalline silicon having a resistivity in the range of 0.01 to 0.02 ohm-centimeter (Ω-cm). A P-type epitaxial layer 32 may be grown on the heavily-doped backside substrate 30. The epitaxial layer 32 may have a resistivity in the range of from 30–40 Ω-cm. Both the backside substrate 30 and the epitaxial layer 32 will be generally referred to as the substrate.

A buried channel implant 34, formed by diffusing a light doping of an opposite carrier-type material (shown as N-) into the (P-type) silicon substrate, extends below the surface of the semiconductor. A threshold adjust implant 36 is formed by diffusing a light doping of the same type (P-type) material (shown as P-) into the substrate after the buried channel implant 34 has been formed. A silicon-dioxide dielectric layer 38 is then grown on the semiconductor surface before the CCD polysilicon gates 22, 24, 26, 28, 30 are applied. Finally, metalization (not shown) for the clock lines is applied and connected to the polysilicon gates via contacts as is well known in the art.

The charge splitter 10 may be fabricated in a similar manner except for the addition of the charge splitting barrier 16 and metalization. The barrier 16 is fabricated by depositing a field oxide barrier over the epitaxial layer 32 in the area defining the barrier 16 before the implant 34 occurs. Placing the field oxide barrier over the epitaxial layer 32 results in a longitudinal separation (i.e., the field oxide barrier 16) in the charge transfer channel.

The polysilicon gates of the charge splitter 10 is also longitudinally divided to provide an A and B clock connections. The A and B clock connections allow charge packets on each side A, B of the barrier 16 to be independently controlled.

Charge transfer within the gates 20 of the charge transfer channel occurs under control of the multi-phase clock. Where unidirectional charge transfer is required by the process, a two-phase clock $\phi_1$, $\phi_2$ as shown in FIG. 2 may be used. Where bidirectional charge transfer is necessary a four-phase clock would typically be used.

For the charge transfer channel 20 of FIG. 2 a two-phase clock would typically be used. When a first phase $\phi_1$ is high +V, a charge packet Q (entering the channel 20 from the left) is attracted to and held in a first potential well 31 under the first gate 30. On the next clock pulse, the first clock signal $\phi_1$ goes low 0 V and the second clock phase $\phi_2$ goes high +V. The charge packet Q, in response, flows to the next potential well 33 under a next gate 22 and so on from left to right in FIG. 2, or from top to bottom in FIG. 1.

FIG. 3 is a time-line diagram of a four-phase charge transfer channel. Using a four-phase clock, the adjacent clock connections of FIG. 2 would be interconnected as shown in FIGS. 3b–3e with a four-phase clock and clocked with the signals shown in FIG. 3a. The threshold implant 36 is also not present with four-phase clocking.

At time $t_1$, clock signals $\phi_1$ and $\phi_2$ are high, such that a potential well 40 is formed for storage of charge 42 under the first two gates. At time $t_2$, clock signal $\phi_1$ has gone low and clock signal $\phi_3$ has gone high, such that the change in the potential well 40 has shifted the charge packet 42 to the right as shown. At time $t_3$ and $t_4$, the charge packet is shifted further to the right in a similar manner. It should be noted that while the illustrated example shows the charge packet 42 being shifted from the left to right, the direction of movement of the charge packet 42 could be changed at any time by a reversal of the phasing of the clock signals $\phi_1$–$\phi_4$.

Each side A, B of the charge splitter 10 of FIG. 1 has an independently controllable clock input signal $\phi_A$, $\phi_B$. Where $\phi_A$, $\phi_B$ are clocked together (with the same magnitude and phase) the splitter 10 performs substantially the same as any other charge transfer gate 20. Where either clock signal $\phi_A$, $\phi_B$ is held at a high level any charge entering the charge splitter 10 will be held on that side A, B of the charge splitter 10.

Where a four-phase clock is used, a charge transfer gate 20 will be assumed to be made up of gates 22, 24, 26, 28 with the first phase $\phi_1$ connected to the first gate 22, the second phase $\phi_2$ connected to the second gate 24, and so on. If a two phase clock were used, gates 22 and 24 would make up a first charge transfer gate 20 and gates 26 and 28 would make up a second gate 20.

Due to mutual charge repulsion, the charge will be uniformly distributed throughout the input gate 28. The charge Q is held within the transfer gate 28 by the high state of the gate's clock signal.

At the appropriate instant, the gate signals $\phi_A$, $\phi_B$ of the charge splitter 10 are both activated (while the gate signal of the input gate 28 is deactivated) to draw the charge Q from the input gate 28 into the charge splitter 10. Because of the characteristics of the splitter 10, part of the charge determined by the splitting ratio (e.g., $Q_A=\frac{1}{3}$) will reside in the A-well and the remainder (e.g., $Q_B=\frac{2}{3}$) will reside in the B-well.

It has been determined that the accuracy of charge splitting can be improved significantly through the use of multiple charge splits. Under an embodiment of the invention, the improved charge splitting process can be iterative (i.e., through use of a single charge splitter have a splitting ratio A:B) or the process may be pipelined through a number of splitters (i.e., through a first charge splitter having an A:B splitting ratio, a second splitter have a C:D ratio, a third splitter having a ratio E:F, etc.).

Where pipeline charge splitting is used, the result of the first split produces charge components A and B. The result of the second charge split (first splitting A and then B and combining) is AD+BC and AC+BD. The result of the third charge split is E(AC+BD)+F(AD+BC) and F(AC+BD)+E (AD+BC).

Where iterative charge splitting is used (i.e., using a single charge splitter have a splitting ratio of A:B) the pipelined result can be simplified to a third charge split result of A(AA+BB)+B(AB+BA) and B(AA+BB)+A(AB+BA), since A=C=E and B=D=F.

Figure 4:
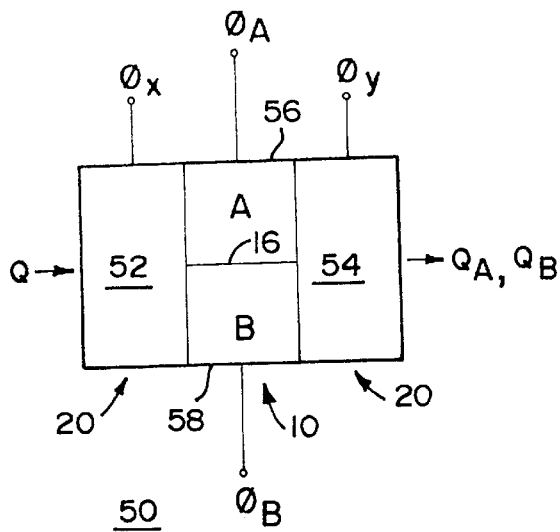
FIG. 4 depicts a charge splitting system in accordance with an embodiment of the invention.

Turning now to FIG. 4 a simplified charge splitter system 50 is shown in accordance with an embodiment of the invention. The charge splitter system 50 includes a charge splitter 10, an input transfer gate 52 and an output transfer gate 54. The charge splitter 10 is assumed to have some unequal splitting ratio A:B (e.g., 1:2) that is characteristic of the splitter's fabrication. This charge splitter 10 is intended to divide an input charge packet into two equal size output packets, but in practice the splitting ratio of an individual splitter 10 will depart from the desired 1:1 ratio by a small amount that is characteristic of the splitter's fabrication. The splitter 50 is assumed to receive an input charge Q and to output two charge packets $Q_A$ and $Q_B$. The splitter 10 of FIG. 4 is assumed to be the same as the splitter 10 of FIG. 1 except that the splitter 10 of FIG. 4 may be assumed to have a splitter barrier gate 12 on each side of the splitter receiving well 14.

For the sake of simplicity, the charge Q will be assumed to have an idealized value of 1 and that the sum of the charge accumulating on each side of the splitter, when added together, equals Q. A and B will be assumed to have a fractional value consistent with the splitting ratio. Also, since AQ+BQ=Q, AQ=$Q_A$=A, and BQ=$Q_B$=B, the letters A and B will be used to refer to the charge packets after the first splitting operation as well as to the splitting fractions, as appropriate.

Under the embodiment, the charge packets are passed through the splitter 10 a number of times to reduce the net error. For purposes of discussion, the error in the splitting ratio will be exaggerated (e.g., A=⅓, B=⅔) instead of ideal (i.e., A=B=½). Table I shows results of charge splitting under the embodiment. On the left side is shown the iteration number. The right side shows the error of each successive iteration under the embodiment.

Under the embodiment, the charge packet Q is transferred into the charge splitter system 50 from the left into the charge transfer gate 52. The gate signals $ø_A$, $ø_B$ are both activated to draw the charge Q from the input gate 52 into the charge splitter 10.

On the next clock cycle, the charge in the A-well 56 (i.e., $Q_A$) is clocked into the next charge transfer gate 54 while the other charge (i.e., $Q_B$) remaining in the B-well 58. $Q_A$ is clocked out of the A-well by causing the clock signal $ø_y$ to go high while the clock signal $ø_A$ of the A-well is caused to go low. $Q_A$ may then be retained in another transfer gate (not shown in FIG. 4) for subsequent iterative splitting operations.

The $Q_B$ charge held in the B-well 58 is retained in the B-well by maintaining the clock signal $ø_B$ high on that side of the splitter 10. During a subsequent clock cycle, the charge $Q_B$ in the B-well is shifted out on the next iterative cycle.

As shown in Table I and at the end of the first splitting operation, $Q_A$ has a value equal to A (which for the example given, equals ⅓). $Q_B$ has a value equal to B (i.e., ⅔). The error (since the goal is a 50—50 split) is 17%.

During a second iterative cycle the two charge packets $Q_A$, $Q_B$ are again divided. The results are then added to reduce the overall error.

The first charge packet $Q_A$ (hereinafter referred to as "A") is again split in a second splitting operation, the result of which can be characterized by multiplying the first charge packet A by the two splitting ratios A, B to produce two smaller charge packets AA and AB. Similarly the second charge packet $Q_B$ (hereinafter referred to as "B") is split in a third splitting operation (multiplied by the two splitting ratios) to produce two smaller charge packets AB and BB.

The AA charge packet of the second splitting operation is added to the BB charge packet of the third splitting operation to produce a new $Q_A$ value AA+BB (i.e., ⅓ Xs ⅓+⅔ Xs ⅔=5/9) assuming A=⅓ and B=⅔. Similarly the AB charge packet of the second split is added to the BA charge packet of the third split to produce a new $Q_B$ value AB+BA (i.e., ⅓ Xs ⅔+⅔ Xs ⅓=4/9). The error of this split (i.e., 5/9–12 or ½–4/9) is now 5.5% as shown in Table I.

Where the first charge packet $Q_A$ (i.e., AA+BB) is again passed through the charge splitter 50, the result of the fourth split is A(AA+BB) and B(AA+BB). Similarly the second charge packet $Q_B$ (i.e., AB+BA) is put through the charge splitter 50 for a fifth split to produce results of A(AB+BA) and B(AB+BA).

As before the opposing elements of the fourth and fifth splits (i.e., A(AA+BB) and B(AB+BA)) are added together to form a new first charge packet $Q_A$. Likewise, the opposing elements of the fourth and fifth splits (i.e., B(AA+BB) and A(AB+BA)) are added together to form a new second charge packet $Q_B$. The error of this split is now 1.85% as shown in Table I.

TABLE I

| Iteration No. | QA | QB | Error |
|---|---|---|---|
| 1 | A | B | 17% |
| 2 | AA + BB | AB + BA | 5.5% |
| 3 | A(AA + BB) + B(AB + BA) | B(AA + BB) + A(AB + BA) | 1.85% |

For the example offered above, the splitting ratio was assumed to be 1:2. A more practical example, however, is the case where the splitting error were to be less than 1%. For the example shown above for an first splitting error or 1%, a second splitting error would be 0.02%. A third splitting error would be 0.0004%.

In the case where the splitting ratio is 0.5%, a second splitting error would be 0.005%. A third splitting error would be 0.00005%.

Implicit in the above-example is that the iterative process could be extended to any number of steps. The number of steps required for any given application must be determined by the accuracy required.

Figure 5:
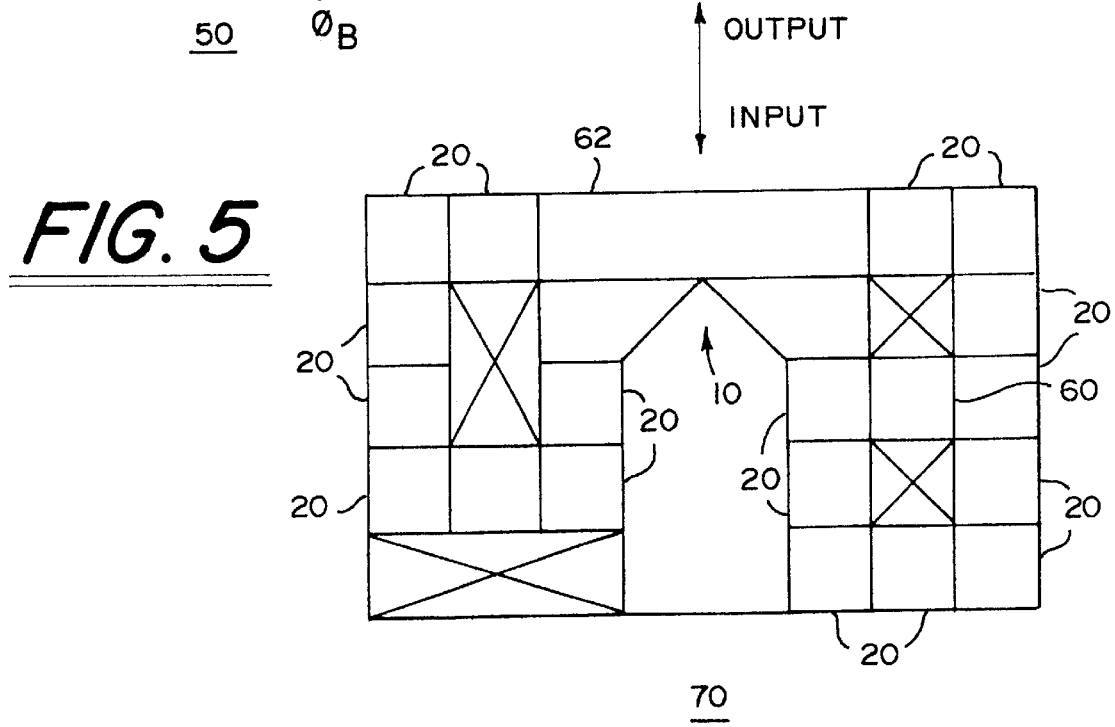
FIG. 5 depicts a specific charge transfer system for the charge splitting system of FIG. 4.

FIG. 5 depicts a practical example of an iterative charge splitting device 70 in accordance with an embodiment of the invention. The charge splitter device 70 is a CCD device containing a splitter 10 and a number of transfer gates 20. The splitting device 70 also includes a charge storage well 60 and an input/output (I/O) gate 62. The storage well 60 is constructed by locating a receiving well between two barrier gates as is well known in the art.

Figure 6:
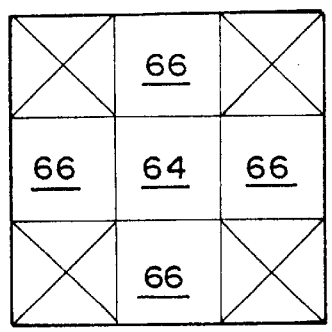
FIG. 6 depicts a particular type of charge transfer and combining gate of FIG. 5.

The I/O gate 62 is a gate similar to those shown in FIG. 1 but capable of receiving (and combining) charges from transfer gates 20 to the left and right of the I/O gate 62. The I/O gate 62 is also constructed to transfer charge into the charge splitter 10 or to receive an input charge from an external source (not shown) or to output a charge, as appropriate. The I/O gate 62 may be constructed as shown in FIG. 6 as a charge well 64 surrounded by a series of barrier gates 66 all as well known in the art.

Figure 7:
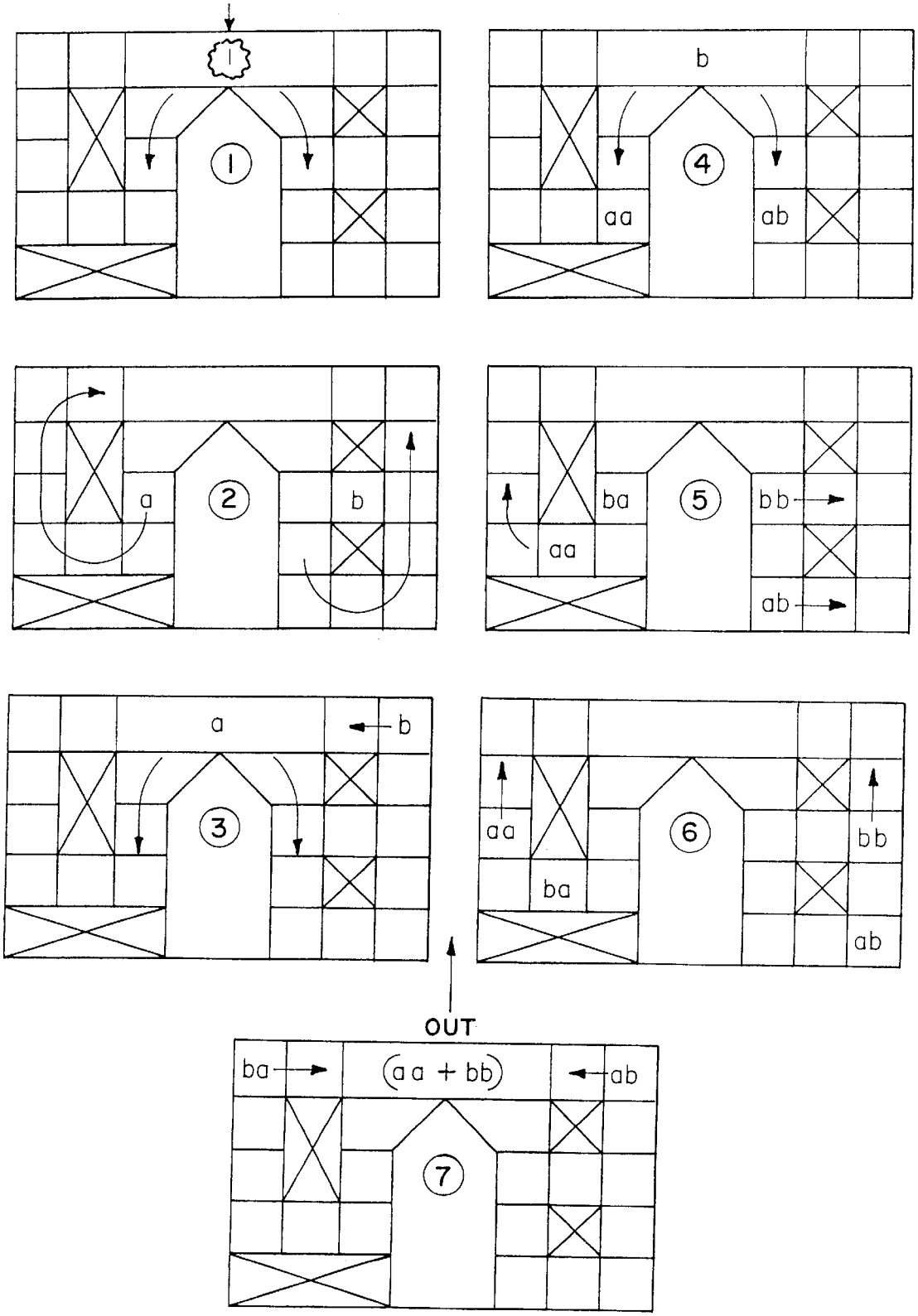
FIG. 7 depicts a sequence of charge transfer states of the apparatus of FIG. 5.

FIG. 7 depicts the charge splitting device 70 during two of the three previously described iterative charge splitting operations. The seven depicted steps show the initial charge split as well as the subsequent splitting of the initially split charges and combining of opposing elements to provide an interim result for the example provided above.

As shown in FIG. 7, for the first step (labeled "1"), a charge is input from an external device (not shown). In the second step the first charge packet "a" is transferred back to the splitter 10 along a circular path going clockwise to the left while the second charge packet "b" is held in the charge well 60 for a sufficient number of clock cycles to allow the first charge packet "a" to reach in the I/O gate 62 in advance of the second charge packet "b".

In the third step of FIG. 7, the first charge packet "a" has returned to the charge splitter 10 and is divided into charge components "aa" and "ab". In the third step of FIG. 7, the charge component "ab" is not transferred into the charge well 60 but is instead routed to the bottom of the charge transfer path shown in the bottom right of FIGS. 5 and 7.

Step 4 of FIG. 7 shows the second charge packet "b" being split within the charge splitter 10 (shown as components "ba" and "bb" in Step 5). Step 4 of FIG. 7 also shows the charge packet "aa" being transferred back to the I/O gate 62 along the circular charge transfer path on the left side.

After splitting the second charge packet "b" the split packet "bb" is transferred through the charge well 60 without delay (step 5) so as to ensure that the split packet "bb" arrives (step 6) at the I/O gate 62 at the same instant as the split component "aa" of the first charge packet "a".

As the two opposing packets "aa" and "bb" reach the I/O gate 62 they are combined within the I/O gate 62. The combined packets "aa" and "bb" may then be output or the process can be repeated.

It is to be understood that the iterative charge splitting process shown in FIG. 7 (using the iterative charge splitting device of FIG. 6) could be terminated after the two iterative charge splitting operations shown (and the resultant packets provided as outputs) or the iterative process may be continued as in the first example. Where the process is to be continued, the iterative process of the embodiment may be continued to achieve degrees of charge splitting accuracy not available with prior charge splitting devices.

Figure 8:
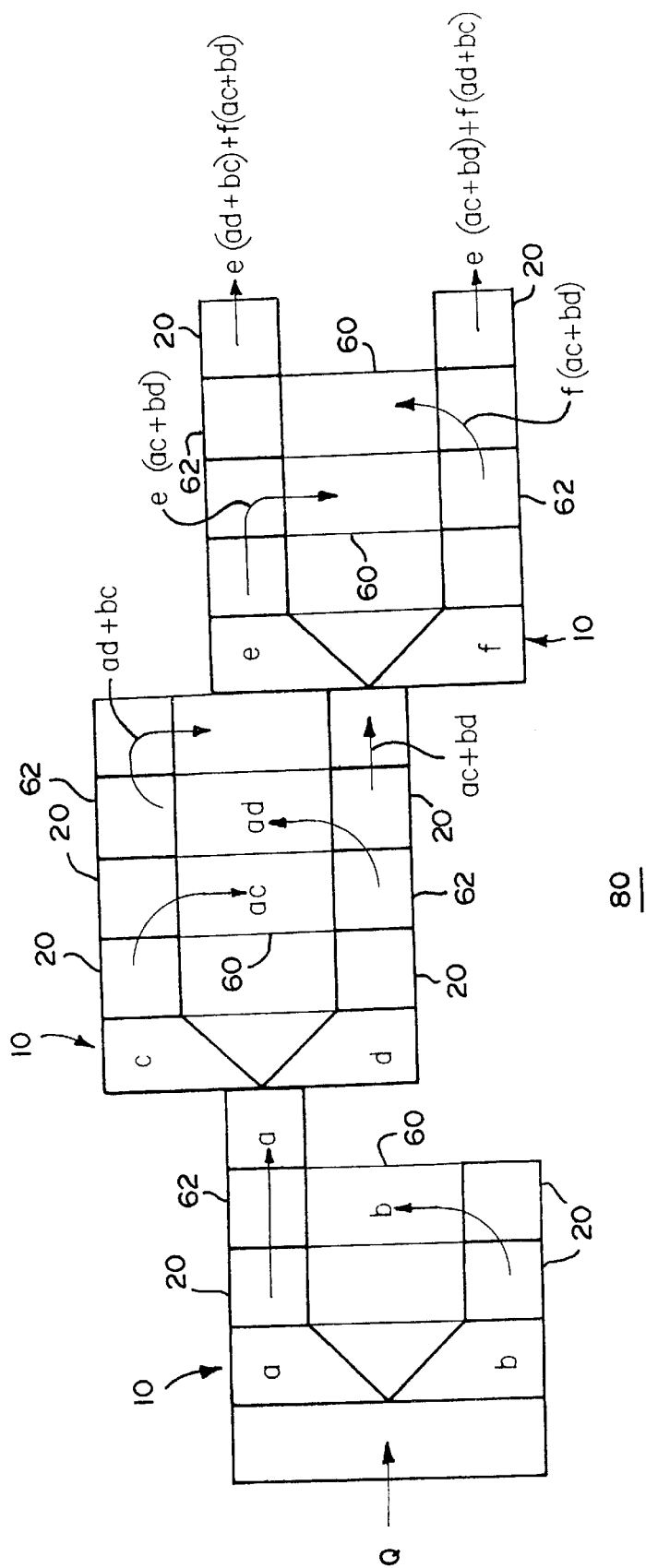
FIG. 8 is an alternate charge transfer system for the charge splitting system of FIG. 4.

Under another embodiment of the invention, iterative charge splitting is accomplished in-line using a number of charge splitting devices 10. Under the embodiment, charge splitters 10, charge transfer gates 20, charge combiners 62, and charge storage wells 60 are combined to provide a charge splitting CCD device 80 (FIG. 8) of high accuracy and speed.

Under the embodiment, a charge Q enters from the left (FIG. 8) and is split into charge packets "a" and "b" (the a packet and b packet) within a first charge splitter 10. The a packet is transferred to second charge splitter 10 (having a c:d charge splitting ratio) while the b packet is transferred to and held in a charge storage well 60.

In the second charge splitter 10 the a packet is split into packets "ac" and "ad" (herein after the ac packet and ad packet). The ac packet enters a second charge well 60. The ad packet is shifted into a third charge well 60.

After splitting the a packet, the b packet is shifted out of the charge well 60 and split in the second (c:d) charge splitter to form a bc packet and a bd packet. The bd charge packet is transferred to where the ac charge packet was previously stored in an adjacent charge well 60 and combined with the ac packet in the charge combiner 62. The sum (i.e., ac+bd) is transferred to and split within the third charge splitter 10 (having a ratio of e:f). The results (i.e., e(ac+bd) and f(ac+bd)) are stored in charge wells 60.

The bc packet split in the second charge splitter 10 is transferred to the charge combiner 62 adjacent the ad packet and combined with the ad packet. The sum (i.e., ad+bc) arrives at the third splitter 10 after (because it had a longer path to travel) the previous sum (ac+b). The ad+bc packet is split within the third splitter to produce the charge packets e(ad+bc) and f(ad+bc). The f(ad+bc) packet is shifted along the charge transfer channel until it is opposite the e(ac+b) packet stored in a charge well 60. The f(ad+bc) and e(ac+bd) are combined in the charge combiner 62 and transferred to an output gate 20. Similarly the e(ad+bc) packet is transferred to the gate opposite the f(ac+bd) packet and combined with the f(ac+bd) packet.

In another embodiment of the invention, charge splitting is used to create precisely proportional charger packets by splitting and combining unequal portions. For example, a charge packet having a value of 1 could be iteratively split to provide precise packets of ½ and ½. One of the packets could, again, be iteratively split to produce packets of ¼ and ¼. One of the products of the second split, ¼ could be added to the remaining product of the first split, ½, to produce a total packet value of ¾. The result is a precisely proportioned 3:1 charge division. In a similar manner the process could be continued to produce any desired proportion.

A specific embodiment of novel methods and apparatus of dividing charge packets within charge coupled devices according to the present invention have been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A method of equalizing a first and a second charge packet within a charge splitter comprising the steps of:

a) splitting the first charge packet into a third charge packet on a first side of the charge splitter and a fourth charge packet on a second side of the charge splitter;

b) splitting the second charge packet into a fifth charge packet on the first side of the charge splitter and a sixth charge packet on the second side of the charge splitter; and c) adding the third and sixth charge packets and the fourth and fifth charge packets.

2. A method of charge splitting in a charge coupled device comprising the steps of:

a) splitting the charge within a charge splitter having a first and second side into first and second charge components;

b) splitting the first charge component into a third charge component on the first side of the charge splitter and a fourth charge component on the second side of the charge splitter;

c) splitting the second charge component into a fifth charge component on the first side of the charge splitter and a sixth charge component n the second side of the charge splitter;

d) adding the third component and sixth component to produce a first split charge and the fourth and fifth components to produce a second split charge; and e) outputting the first and second split charges as a charge splitter output.

3. The method as in claim 2 further comprising the step of transferring the first and second charge components out of the charge splitter.

4. The method as in claim 3 further comprising the step of transferring the first charge component back to the charge splitter.

5. The method as in claim 3 further comprising the step of transferring the second charge component back to the charge splitter.

6. The method as in claim 2 further comprising the steps of repeating steps b through d and at least second time using the first split charge as a first charge component and the second split charge as the second charge component.

7. A method of charge splitting in a charge coupled device comprising the steps of:

splitting the charge within a charge splitter having a first and second side into first and second charge components;

transferring the first and second charge components out of the charge splitter;

transferring the first charge component back to the charge splitter and splitting the first charge component into a third charge component on the first side of the charge splitter and a fourth charge component on the second side of the charge splitter;

transferring the second charge component back to the charge splitter and splitting the second charge component into a fifth charge component on the first side of the charge splitter and a sixth charge component on the second side of the charge splitter;

adding the third component and sixth component to produce a first split charge and the fourth and fifth components to produce a second split charge; and outputting the first and second split charges as a charge splitter output.

* * * * *